United States Patent [19]

Ijichi

[11] 4,379,269

[45] Apr. 5, 1983

[54] RF AMPLIFIER HAVING AUTOMATIC GATE BIAS SWITCHING IN RESPONSE TO BAND SELECTION

[75] Inventor: Sadayoshi Ijichi, Soma, Japan

[73] Assignee: Alps Electric Co., Ltd., Tokyo, Japan

[21] Appl. No.: 239,607

[22] Filed: Mar. 2, 1981

[30] Foreign Application Priority Data

Mar. 4, 1980 [JP] Japan .................................. 55-27111

[51] Int. Cl.³ .......................... H03F 3/193; H03J 5/24; H04N 5/44
[52] U.S. Cl. .................................... 330/277; 330/278; 330/296; 330/305; 334/56; 358/191.1; 455/188
[58] Field of Search ............... 330/277, 278, 296, 305; 334/56–58, 47; 455/188, 233; 358/191.1

[56] References Cited

U.S. PATENT DOCUMENTS 4,048,598  9/1977  Knight ........................... 455/188 X Primary Examiner—James B. Mullins
Attorney, Agent, or Firm—Guy W. Shoup; Gerard F. Dunne

[57] ABSTRACT

Herein disclosed is an RF amplifier which is equipped with a high-frequency amplifying element such as a dual gate MOS FET having its first gate fed with a bias voltage and its second gate fed with an AGC voltage, in which a switching diode is fed with a switching voltage thereby to switch the bands, in which the voltage at a voltage dividing point where the switching voltage is divided is used as the bias voltage, and in which the voltage at the dividing point is so raised upon the reception of a high band as to make the effect of the AGC uniform upon the receptions of the low and high bands.

5 Claims, 7 Drawing Figures

RF AMPLIFIER HAVING AUTOMATIC GATE BIAS SWITCHING IN RESPONSE TO BAND SELECTION

BACKGROUND OF THE INVENTION

The present invention relates to an RF amplifier, and more particularly to an RF amplifier which is equipped with a dual gate field effect transistor, i.e. an FET.

In the antenna tuning circuit for a VHF electronic tuner according to the prior art, for example, a dual gate MOS FET is so constructed that its first gate is fed with a signal voltage whereas its second gate is fed with an automatic gain control (AGC) voltage. The first gate is typically impressed with a predetermined bias voltage, as shown in FIG. 1, wherein reference numerals 1, 2 and 3 appearing in FIG. 1 indicate the dual gate MOS FET, the first gate and the second gate thereof, respectively. Numerals 4, 5 and 6 indicate a variable capacitance circuit unit, a band switching circuit unit and a bias voltage supply unit, respectively. Numerals 7, 8 and 9, 10, 11 and 12, 13 to 16, and 17 indicate a variable capacitance diode, two coils, a switching diode, two condensers, four resistors, and a biasing high resistor, respectively. Numeral 18 indicates a tuning voltage terminal. Numerals 19, 20 and 21 indicate a high-band selecting voltage terminal, a low-band selecting voltage terminal, and a biasing voltage supply terminal, respectively. Moreover, numerals 22 and 23 indicate a coupling condenser and a resistor, respectively.

Upon the selection of a high band, the terminal 19 is impressed with a positive voltage. In this case, a current biasing the switching diode 10 in the forward direction flows through the resistor 14, the diode 10, the coil 9 and the resistor 15. As a result, since the diode 10 is forwardly biased, the coil 9 is short-circuited in view of the high frequency through the diode 10 and the condenser 11 so that the coil 8 and the condenser 11 coact with the variable capacitance circuit unit 4 thereby to be tuned to a channel within the high band. Upon the selection of a low band, on the contrary, the terminal 20 is impressed with a positive voltage. In this case, since the current flows through the resistors 16 and 15, the diode 10 is biased in the backward direction through the coil 9 so that the diode 10 is held at its nonconductive state while allowing no current to pass therethrough. As a result, the coils 8 and 9 and the condenser 12 coact with the variable capacitance circuit unit 4 so that they are tuned to a channel within the low band.

In the conventional antenna tuning circuit having the construction thus far described, a predetermined bias voltage is supplied, as shown, from the terminal 21 through the resistor 17. As a result, in case the frequency difference between the high and low bands is high, as in the VHF band of the USA, for example, the performane of the AGC becomes different between the high and the low bands.

SUMMARY OF THE INVENTION

It is therefore an object of the present invention to provide an RF amplifier which is equipped with a dual gate FET for uniformly effecting the AGC when different frequencies are to be amplified.

Another object of the present invention is to provide an RF amplifier which is suitable for the antenna tuning circuit of a TV tuner for automatically switching the bias voltage to the gate of an FET when high and low bands are to be selected.

A further object of the present invention is to provide an RF amplifier which has its circuit construction so simplified that it can be mass produced at a low cost.

According to the present invention, there is provided an RF amplifier of the type equipped with a high-frequency amplifying element such as a dual gate MOS FET fed with a bias voltage at the first gate thereof and with an AGC voltage at the second gate thereof. A switching diode is fed with a switching voltage thereby to effect the change of bands, and to also change the voltage at a voltage dividing point. This latter voltage is made higher upon the reception of a high band thereby to select the aforementioned bias voltage at a high level, whereby the performance of the AGC is made uniform upon the reception of both the low and high bands.

Further objects and advantages of the present invention will become more apparent from the following description taken in connection with the embodiments thereof with reference to the accompanying drawings.

DESCRIPTION OF THE PREFERRED EMBODIMENTS

Figure 1:
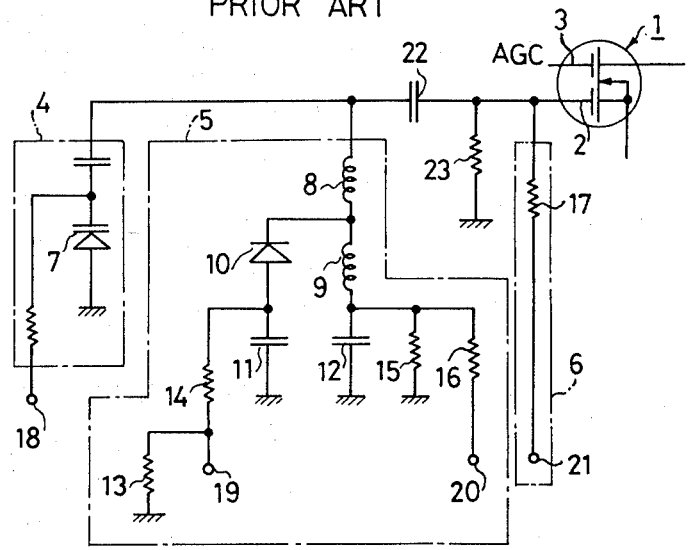
FIG. 1 is a circuit diagram showing one example of the antenna tuning circuit of a VHF electronic tuner according to the prior art.
Figure 2:
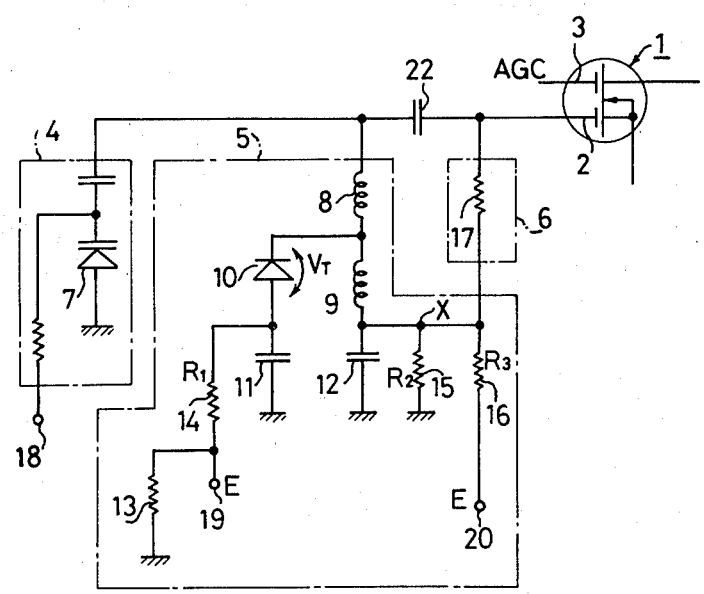
FIG. 2 is a circuit diagram showing the antenna tuning circuit of a VHF electronic tuner according to one embodiment of the present invention.

In FIG. 2, reference numerals 1 to 20 and 22 correspond to those appearing in FIG. 1. Reference letter X in FIG. 2 indicates a voltage dividing point specified in the present invention. In the shown construction, the biasing high resistor 17 has its one terminal connected with the first gate 2 and its other terminal connected with the shown point X. Moreover, the circuit construction is of the form in which the resistor 23 shown in FIG. 1 can be omitted.

Upon the selection of a high band, since the terminal 19 is impressed with a positive voltage similarly to the case shown in FIG. 1, the current flows through the resistor 14, the diode 10, the coil 9 and the resistor 15 so that the coil 9 is short-circuited in view of the high frequency through the diode 10 and the condenser 11. Here, a voltage $V_x$ appearing at the shown voltage dividing point X is impressed upon the first gate 2 through the resistor 17. It goes without saying that the aforementioned voltage $V_x$ can be used, as it is, as the bias voltage because the DC input resistance of the first gate 2 is remarkably high. Upon the selection of a low band, on the contrary, the terminal 20 is impressed with a positive voltage similarly to the case shown in FIG. 1 so that the diode 10 is biased in the backward direction. At this time, moreover, the voltage $V_x'$ at the voltage dividing point X by the resistors 16 and 15 is impressed as the bias voltage upon the first gate 2.

Generally speaking, the shown MOS FET 1 has its AGC advanced, as shown in FIG. 3(B), if the bias voltage $VG_1$ at the first gate 2 is made higher. Further, the AGC is delayed if the bias voltage applied to the gate 2 is lowered.

In the instance of the present invention, if the resistors 14, 15 and 16 have resistances $R_1$, $R_2$ and $R_3$, respectively, and if the voltage to be fed to the terminals 19 and 20, respectively, and the ON voltage of the diode 10 are denoted at E and $V_T$, respectively, the following relationships result: Specifically, the voltage $V_x$ at the voltage dividing point X upon the selection of the high band is given by the following Equation:

$$V_x = \frac{R_2(E - V_T)}{R_1 + R_2} \qquad (1)$$

On the other hand, the voltage $V_x'$ at the voltage dividing point upon the selection of the low band is given by the following Equation:

$$V'_x = \frac{R_2 E}{R_2 + R_3} \qquad (2)$$

Figure 3:
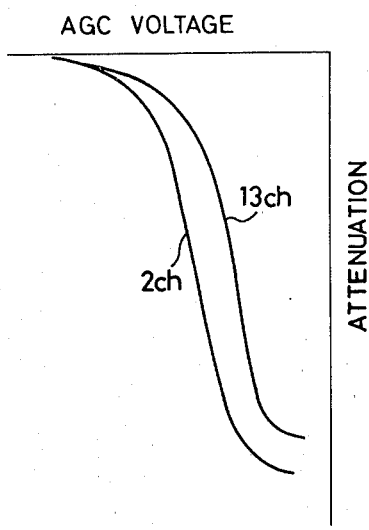
FIGS. 3(A), 3(B) and 3(C) are diagrams for illustrating the performances of an AGC.
Figure 3:
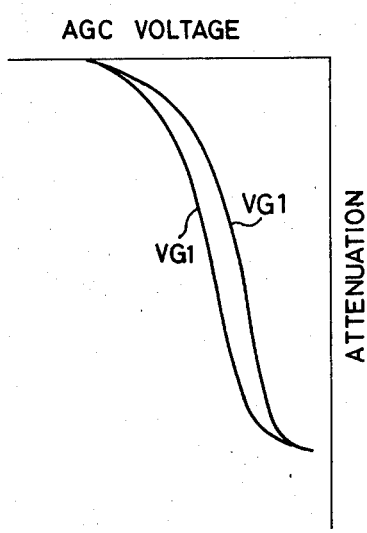
Figure 3:
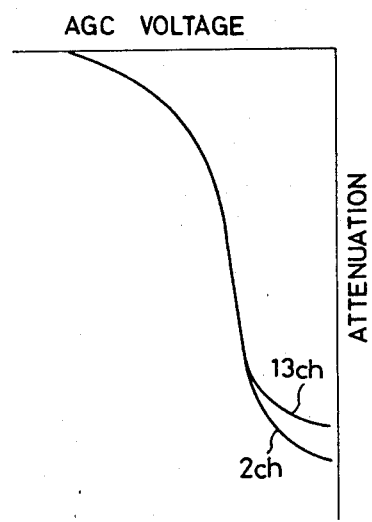

The performance of the AGC can be made substantially identical for the high and low bands, as shown in FIG. 3 (C), by selecting an appropriate bias voltage corresponding to the difference in the performance of the AGC between the high and low bands shown in FIG. 3(A), in the manner to be defined by the following inequality:

$$V_x > V_x' \qquad (3)$$

so that it may be compensated by making use of the phenomenon shown in FIG. 3(B).

Figure 4:
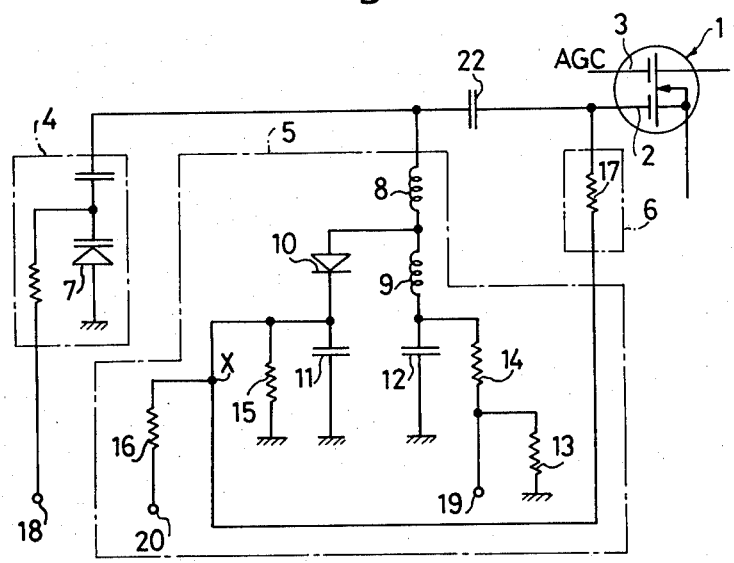
FIG. 4 is a circuit diagram showing the antenna tuning circuit of a VHF electronic tuner according to another embodiment of the present invention.

FIG. 4 shows another embodiment of the present invention. Reference numerals appearing in FIG. 4 correspond to those in FIG. 2, and the circuit construction is substantially identical to that shown in FIG. 2 except that the connecting polarity of the diode 10 is opposite to that of FIG. 2.

Figure 5:
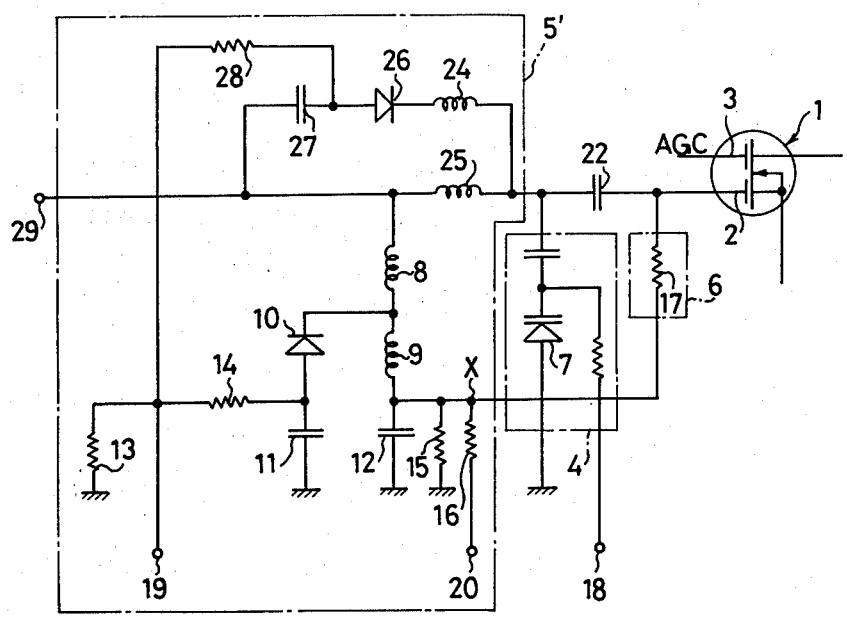
FIG. 5 is a circuit diagram showing the antenna tuning circuit of a VHF electronic tuner according to a further embodiment of the present invention.

FIG. 5 shows a further embodiment of the present invention. Reference numerals 1 to 4, 6 to 20 and 22 correspond to those appearing in FIG. 2. Numeral 5' indicates a band switching unit for effecting the switching operations including that of a matching circuit. Moreover, Numerals 24 and 25, 26, 27, 28 and 29 indicate two coils, a switching diode, a condenser, a resistor and a signal terminal, respectively.

The operations of the shown embodiment are identical on principle to those of the embodiment shown in FIG. 2 except that the coil 24 and the condenser 27 take, upon the selection of the high band, the shape in which they are connected in parallel with the coil 25 and that the series circuit of the coil 24 and the condenser 27 is rendered ineffective upon the selection of the low band.

What is claimed is:

1. An RF amplifier of the type equipped with a dual gate MOS FET, comprising:
   input means receptive to frequencies of high and low bands;
   selecting means for feeding the first gate of said FET selectively with either frequencies in said high band or frequencies in said low band;
   means for feeding the second gate of said FET with an automatic gain control (AGC) voltage; and
   means for feeding the first gate of said FET with a bias voltage differing in accordance with the selecting of either said high or said low band.

2. An RF amplifier according to claim 1, wherein said selecting means includes a switching diode.

3. An RF amplifier according to claim 2, wherein said switching diode includes first and second voltage supply means for selectively feeding the anode and cathode thereof with a DC voltage.

4. An RF amplifier according to claim 3, wherein either of said first and second voltage supply means includes a voltage divider having resistors so that the divided voltage by said voltage divider is fed as said bias voltage to the first gate of said FET.

5. An RF amplifier according to claim 4, wherein said divided voltage is so preset that it becomes higher upon the reception of the high band than that upon the reception of the low band.

* * * * *